United States Patent
Xu et al.

(10) Patent No.: US 11,228,026 B2
(45) Date of Patent: Jan. 18, 2022

(54) TWO PHASE SHELL FORMATION ON METAL NANOSTRUCTURES

(71) Applicant: HONDA MOTOR CO., LTD., Tokyo (JP)

(72) Inventors: Qingmin Xu, Dublin, OH (US); Christopher J. Brooks, Dublin, OH (US); Ryan K. McKenney, Roseville, MN (US)

(73) Assignee: HONDA MOTOR CO., LTD., Tokyo (JP)

( * ) Notice: Subject to any disclaimer, the term of this patent is extended or adjusted under 35 U.S.C. 154(b) by 63 days.

(21) Appl. No.: 16/444,900

(22) Filed: Jun. 18, 2019

(65) Prior Publication Data
US 2019/0393490 A1    Dec. 26, 2019

Related U.S. Application Data

(60) Provisional application No. 62/687,637, filed on Jun. 20, 2018.

(51) Int. Cl.
| | |
|---|---|
| *H01M 4/36* | (2006.01) |
| *H01M 10/05* | (2010.01) |
| *C23C 18/12* | (2006.01) |
| *H01M 4/02* | (2006.01) |
| *C01B 7/20* | (2006.01) |
| *C01B 7/19* | (2006.01) |

(Continued)

(52) U.S. Cl.
CPC .......... *H01M 4/366* (2013.01); *C23C 18/127* (2013.01); *H01M 10/05* (2013.01); *B82Y 30/00* (2013.01); *B82Y 40/00* (2013.01); *C01B 7/197* (2013.01); *C01B 7/20* (2013.01); *C23C 16/22* (2013.01); *C23C 18/00* (2013.01); *C23C 18/125* (2013.01); *C23C 18/24* (2013.01); *H01M 2004/028* (2013.01)

(58) Field of Classification Search
CPC ................................ H01M 4/04; C23C 18/16
See application file for complete search history.

(56) References Cited

U.S. PATENT DOCUMENTS

| | | |
|---|---|---|
| 4,052,539 A | 10/1977 | Shropshire et al. |
| 7,722,993 B2 | 5/2010 | Potanin |

(Continued)

FOREIGN PATENT DOCUMENTS

| | | |
|---|---|---|
| CN | 103087805 A | 5/2013 |
| DE | 10 2014 211 907 A1 | 12/2014 |

(Continued)

OTHER PUBLICATIONS

International Search Report and Written Opinion, issued by International Searching Authority in corresponding International Application No. PCT/US2019/038230, dated Sep. 20, 2019.

(Continued)

*Primary Examiner* — Austin Murata
(74) *Attorney, Agent, or Firm* — Arent Fox LLP

(57) ABSTRACT

The present disclosure relates to a method of making an electrochemically active material, which comprises metal nanostructures encapsulated in $LaF_3$ shells. The electrochemically active material may be included in an electrode of an F-shuttle battery that includes a liquid electrolyte, which, optionally, allows the F-shuttle batteries to operate at room temperature.

17 Claims, 12 Drawing Sheets

(51) Int. Cl.
| | |
|---|---|
| B82Y 40/00 | (2011.01) |
| C23C 18/00 | (2006.01) |
| C23C 18/24 | (2006.01) |
| C23C 16/22 | (2006.01) |
| B82Y 30/00 | (2011.01) |

(56) References Cited

U.S. PATENT DOCUMENTS

| | | |
|---|---|---|
| 9,166,249 B2 | 10/2015 | Darolles et al. |
| 2003/0008145 A1 | 1/2003 | Goldstein |
| 2006/0070491 A1 | 4/2006 | Yang et al. |
| 2007/0087195 A1 | 4/2007 | Meyer et al. |
| 2007/0218009 A1 | 9/2007 | Van Veggel et al. |
| 2007/0274664 A1 | 11/2007 | Van Veggel et al. |
| 2008/0176076 A1 | 7/2008 | Van Veggel et al. |
| 2008/0247932 A1* | 10/2008 | Li .................. C01F 17/265 423/263 |
| 2009/0029237 A1 | 1/2009 | Yazami |
| 2010/0001209 A1 | 1/2010 | Osinski et al. |
| 2010/0178227 A1 | 7/2010 | Kim et al. |
| 2011/0143219 A1 | 6/2011 | Weiss et al. |
| 2012/0270231 A1 | 10/2012 | Smith et al. |
| 2013/0092885 A1 | 4/2013 | Cho et al. |
| 2013/0130109 A1 | 5/2013 | Archer et al. |
| 2013/0133934 A1 | 5/2013 | Flores et al. |
| 2013/0171060 A1 | 7/2013 | Vo-Dinh et al. |
| 2013/0196844 A1 | 8/2013 | Keller et al. |
| 2014/0377457 A1 | 12/2014 | Liu et al. |
| 2015/0053464 A1 | 2/2015 | Jeong et al. |
| 2015/0118496 A1 | 4/2015 | Cho et al. |
| 2015/0194661 A1 | 7/2015 | Ju et al. |
| 2015/0328629 A1 | 11/2015 | Cho et al. |
| 2018/0175382 A1 | 6/2018 | Chou et al. |

FOREIGN PATENT DOCUMENTS

| | | |
|---|---|---|
| JP | 2015-8136 A | 1/2015 |
| KR | 10-2016-0047022 A | 5/2016 |
| WO | WO 2009/157033 A2 | 12/2009 |
| WO | WO 2016/047906 A1 | 3/2016 |

OTHER PUBLICATIONS

B.P. Sobolev et al., "Mechanochemical Synthesis of Nonstoichiometric Fluorite Ca1-xLaxF2+x Nanocrystals from CaF2 and LaF3 Single Crystals" Crystallography Reports, vol. 50, No. 3, pp. 478-485, 2005.

Charles J. McDonald et al., "Hollow: latex particles: synthesis and applications" Advanced in Colloid and Interface Science, vol. 99, pp. 181-213, 2002.

David Lou et al., "Hollow Micro-/Nanostructures: Synthesis and Applications", Advanced Materials, vol. 20, pp. 3987-4019, 2008.

David W. Oxtoby et al., "Electrochemistry", Principles of Modern Chemistry, 4th Edition, Saunders College Publishing pp. 401-443, 1999.

Hiroyuki Ohno, "Electrochemical Aspects of Ionic Liquids" Wiley-Interscience, New York, 2005. (409 Pages Total).

Hoe Jin Hah et al. "New synthetic route for preparing rattle-type silica particles with metal cores" Chem. Commun., pp. 1012-1013, 2004.

J. McBreen et al., "New approaches to the design of polymer and liquid electrolytes for lithium batteries", Journal of Power Sources, vol. 89, pp. 163-167, 2000.

Lukasz Gorski et al. "Complexes of tetra-tert-butyl-tetraazaporphine with Al(III) and Zr(IV) cations as fluoride selective ionophores" Analytics Chimica Acta 633, pp. 181-187, 2009.

Lukasz Gorski et al., "Fluoride-selective polymeric membrane electrodes based on Zr(IV)-and Al(III)-salen ionophores of various structures", Analytics Chimica Acta 655, pp. 39-46, 2010.

N. I. Sorokin et al., "Nonstoichiometric Fluorides-Solid Electrolytes for Electrochemical Devices: A Review" Crystallography Reports, vol. 52., No. 5., pp. 842-863, 2007.

Nanditha G, Nair et al., "Fluorinated Boroxin-Based Anion Receptors for Lithium Ion Batteries: Fluoride Anion Binding, Ab Initio Calculations, and Ionic Conductivity Studies", The Journal of Physical Chemistry A, vol. 113, pp. 5918-5926, May 2009.

P.J. Gellings et al., "The CRC Handbook of Solid State Electrochemistry", CRC Press, pp. 195-222, 1997.

Perrin Walker et al., "Handbook of Metal Etchants", CRC Press 1991. (1428 Pages Total).

PubChem. Citrate May 27, 2016. Retrieved from Internet: <URL: http://pubchem.ncbi.nim.nih.gov/compound/citrate>, as viewed on Feb. 6, 2018. (21 Pages Total).

Shinobu Fujihara et al., "Sol-Gel Processing of LaF3 Thin Films" Journal of the Ceramic Society of Japan vol. 106, pp. 124-126, 1998.

Shlomo Magdassi et al., "Copper Nanoparticles for Printed Electronics: Routes Towards Achieving Oxidation Stability" Materials, vol. 3, pp. 4626-4638, 2010.

Stephan Rudiger et al., "The fluorolytic sol-gel route to metal fluorides—a versatile process opening a variety of application fields", Dalton Transactions, No. 9, pp. 1117-1127, 2008.

V. Trnovcova et al., "Fluoride Solid Electrolytes", Russian Journal of Electrochemistry, vol. 45, No. 6, pp. 630-639, 2009.

William C. West et al., "Reversible Intercalation of Fluoride-Anion Receptor Complexes in Graphite", Journal of the Electrochemical Society, vol. 154, pp. A929-A936, 2007.

Written Opinion and International Search Report of related foreign application No. PCT/US2017/066800 dated Mar. 5, 2018.

M. Anji Reddy et al., "Batteries based on fluoride shuttle", Journal of Materials Chemistry, vol. 21, No. 43, pp. 17059-17062, Nov. 21, 2011.

* cited by examiner

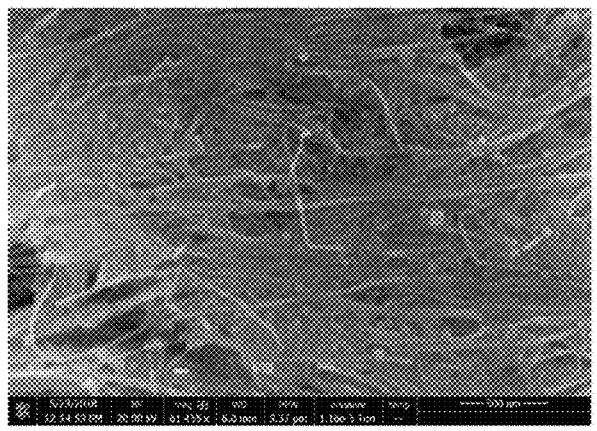 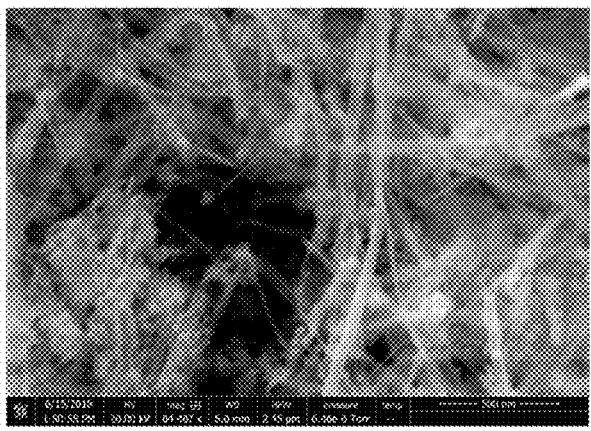
FIG. 7A                    FIG. 7B

TWO PHASE SHELL FORMATION ON METAL NANOSTRUCTURES

CROSS REFERENCE TO RELATED APPLICATIONS

This application claims priority to U.S. Patent Application No. 62/687,637, entitled "Two Phase Shell Formation on Copper Nanowires," filed Jun. 20, 2018. The preceding application is incorporated herein by reference in its entirety.

BACKGROUND

Metal nanoparticles are highly desirable for use in a number of applications including as catalysts, and as electrode materials for batteries. However, the use of metal nanoparticles may be limited by the system operating conditions or other factors.

F (fluoride) shuttle batteries are a novel and underexplored alternative next generation energy storage. The energy density is much larger than lithium ion batteries, around four times in volumetric and two times at gravimetric densities. F-shuttle batteries offer lower cost and/or improved characteristics compared to lithium and lithium-ion batteries. Fluoride-ion batteries are electrochemical cells that operate via fluoride-mediated electrode reactions. For example, $F^-$ anions are shuttled between the cathode and the anode electrodes. During discharge, $MeF_x$ is reduced to Me (metal) or low valence $MeF_x$ and releases $F^-$ ions at the cathode side. Meanwhile, $F^-$ ions combine with metal to form $MeF_x$ and release electrons at the anode side. F-shuttle batteries can be manufactured as primary or secondary batteries.

There are two types of F-shuttle batteries, i.e., all-solid-state type and liquid type. Currently most of the research being conducted is focused on all-solid-state F-shuttle batteries, which may be rechargeable at elevated temperatures to some extent. However, slow reaction kinetics impose significant challenges to all-solid-state F-shuttle batteries. Fluoride-ion systems have been demonstrated in the solid state, for example, in U.S. Pat. No. 7,722,993 to Potanin, which describes an embodiment of a secondary electrochemical cell where fluoride ions are reversibly exchanged between anode and cathode electrodes during charge-discharge cycles, with these electrodes in contact with a solid-state fluoride-conducting electrolyte. Potanin describes solid state electrolytes containing fluorides of La, Ce or the compound fluorides based on them, together with alloying additives, such as fluoride/fluorides of alkaline-earth metals ($CaF_2$, $SrF_2$, $BaF_2$) and/or fluorides of alkaline metals (LiF, KF, NaF) and/or alkaline metal chlorides (LiCl, KCl, NaCl), as well as a wide range of other compound fluorides. However, such electrochemical cells only operate usefully above room temperature (e.g. 150° C.) due to the limited conductivity of the solid-state electrolyte.

Reaction kinetics are good in the liquid type F-shuttle batteries. However, this type of F-shuttle battery still faces many challenges, such as the lack of good electrolytes and reversible cathode/anode materials at room temperature.

Attempts have also been made to provide fluoride ion-based electrochemical systems capable of using liquid electrolytes. For example, US 2011/0143219 A1 by Weiss et al. and U.S. Pat. No. 9,166,249 by Darolles et al. disclose fluoride-ion battery configurations that include a solvent-borne fluoride salt that is at least partially present in a dissolved state in the electrolyte. However, for many applications the chemical reactivity of the electrode materials with the liquid electrolyte is significant, and these liquid electrolyte systems do not provide sufficiently reliable high discharge and/or high capacity operation.

SUMMARY

The following presents a simplified summary of one or more aspects of the present disclosure in order to provide a basic understanding of such aspects. This summary is not an extensive overview of all contemplated aspects and is intended to neither identify key or critical elements of all aspects nor delineate the scope of any or all aspects. Its purpose is to present some concepts of one or more aspects in a simplified form as a prelude to the more detailed description that is presented later.

According to some aspects, the present disclosure is directed to a method of making an electrochemically active structure; the method comprises dispersing a metal nanostructure in a first organic solvent to form a first suspension; adding a first amount of tetrabutylammonium bromide to the first suspension; adding a lanthanum(III) nitrate water solution to the first suspension; removing the water from the first suspension to form a first organic solvent layer; adding a second amount of tetrabutylammonium bromide to the first organic solvent layer to form a second suspension; adding a NaF water solution to the second suspension; removing the water from the second suspension to form a second organic solvent layer; and adding a second organic solvent to the second organic solvent layer to distribute the metal nanostructure having a $LaF_3$ shell.

It should be understood that the removing of water is non-limiting and can be the removing of an organic solvent from water, the removing of water from an organic solvent, and various combination of techniques therein comprising the separation of water from another solvent as various techniques are known in the art.

According to some aspects, the methods disclosed herein can produce electrochemically active nanostructures comprising a metal core with an $LaF_3$ shell. The metal core can be, by way of non-limiting example, copper. The electrochemically active nanostructures can be used in a battery. A battery comprising the metal core-$LaF_3$ shell nanostructures and a liquid electrolyte can be an F-shuttle battery with improved performance.

In some embodiments, the present disclosure is directed to an electrochemical cell comprising an electrochemically active material made using the methods disclosed herein. The electrochemical cell can comprise, for example, an F-shuttle cell or battery.

These and other aspects of the invention will become more fully understood upon a review of the detailed description, which follows.

BRIEF DESCRIPTION OF THE DRAWINGS

FIG. 7A shows an SEM image of Cu nanowires after initial synthesis and before the two phase shell formation, according to some aspects of the present disclosure.

FIG. 7B shows an SEM image of two phase $LaF_3$ shell formation on Cu nanowires, according to some aspects of the present disclosure.

DETAILED DESCRIPTION

Figure 1A:
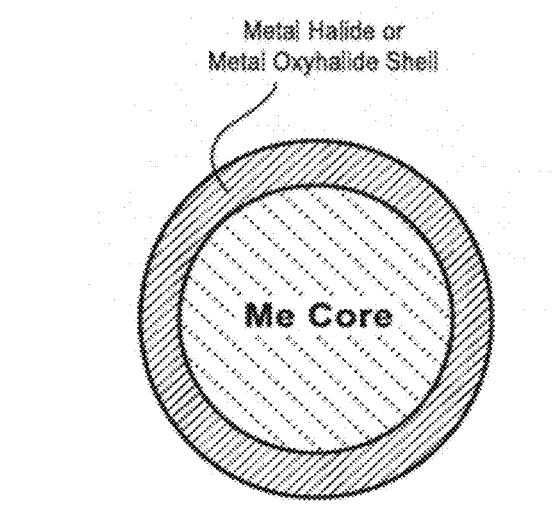
FIG. 1A shows a cross section of a core-shell nanoparticle including a core comprising a metal nanoparticle, and a shell comprising a metal halide or a metal oxyhalide in an aspect of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

According to some aspects, the present disclosure is directed to a method of making an electrochemically active material comprising providing an organic solution including a metal nanostructure, adding a first amount of one or more quaternary amine salts to the organic solution, adding a lanthanum salt to the organic solution, optionally removing water from the organic solution, adding a second amount of one or more quaternary amine salts to the organic solution, adding a fluoride source to the organic solution, to form an $LaF_3$ shell on the metal nanostructure, optionally removing water from the organic solution, and optionally adding an organic solvent to the organic solution to distribute the $LaF_3$ coated metal nanostructure.

According to some aspects, the metal can comprise a transition metal selected from scandium, titanium, vanadium, chromium, manganese, iron, cobalt, nickel, copper, zinc, yttrium, zirconium, niobium, molybdenum, technetium, ruthenium, rhodium, palladium, silver, cadmium, lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, osmium, iridium, platinum, gold, mercury, actinium, thorium, protactinium, uranium, neptunium, plutonium, americium, curium, berkelium, californium, einsteinium, fermium, mendelevium, nobelium, lawrencium, or a combination thereof. In some embodiments, the metal comprises copper.

It should be understood that as used herein, removing water from the organic solution is non limiting and can comprise separating the organic solvent from the water or the water from the organic solvent by any means known in the art.

According to some aspects, a suspension of metal nanostructures is provided in an organic solution, and various methods disclosed herein are applied to the suspension of metal nanostructures, producing a $LaF_3$ coated metal nanostructure. According to some aspects, the $LaF_3$ coated metal nanostructure can be used in an electrochemical cell, in a battery, in any device as a catalyst or as a means to improve performance and efficiency of a device.

According to some aspects, a method of making a core shell structure (or electrochemically active material) is provided herein, the method comprising: dispersing a metal nanostructure in a first organic solvent to form a first suspension; adding a first amount of a quaternary amine salt to the first suspension; adding a lanthanum salt solution to the first suspension; removing the water from the first suspension to form a first organic solvent layer; adding a second amount of a quaternary amine salt to the first organic solvent layer to form a second suspension; adding a fluoride source solution to the second suspension to form a $LaF_3$ shell on the metal nanostructure; removing the water from the second suspension to form a second organic solvent layer; and adding a second organic solvent to the second organic solvent layer to distribute the metal nanostructure having a $LaF_3$ shell. The method may further comprise collecting the metal nanostructure having the $LaF_3$ shell; and optionally washing the metal nanostructure having the $LaF_3$ shell with a third organic solvent. According to some aspects, the quaternary amine salt is tetrabutylammonium bromide. In some embodiments, the lanthanum salt solution is lanthanum (III) nitrate solution. In some aspects, the fluoride source solution is a NaF solution.

In some embodiments, the metal nanostructure comprises copper nanowires; both the first and the second amounts of quaternary amine salt are tetrabutylammonium bromide; the lanthanum salt is $La(NO_3)_3$; and the fluoride source is NaF.

According to some aspects, the first organic solvent comprises toluene. The second and third organic solvents can each comprise ethanol. However various organic solvents can be utilized by those skilled in the art, and the present disclosure is not limited by describing the use of organic solvents as it is known in the art that some organic solvents can be substituted for other organic solvents depending on known solvent properties.

According to some aspects, the present disclosure is related to electrochemically active materials, and fluoride-ion battery systems that include electrode materials with tailored structures and compositions to improve battery performance. In some aspects, the present disclosure is related to core-shell nanoparticles, devices incorporating the core-shell nanoparticles, as well as methods of making and using the core-shell nanoparticles and devices including the core-shell nanoparticles.

As used herein, the core is not limited to particles, e.g., spherical particles, and also encompasses structures including, but not limited to, nanoparticles, nanotubes, nanowires, frames, flakes, nanosheets, thin films, and foams. In an embodiment, the size of the core material is determined either by electron conductivity or F– ion mobility.

Primary and secondary electrochemical cells, such as batteries, utilizing fluoride ion charge carriers, active electrode materials, and suitable liquid electrolytes can provide an alternative to conventional state of the art lithium batteries and lithium ion batteries. Non-limiting examples of suitable liquid electrolytes are described in the art, as described in, for example, US 2017/0062874 A1 by Jones et al. Such fluoride-ion battery (FIB) systems can operate usefully at room temperature while utilizing fluoride anions carried in a liquid electrolyte as at least some of the charge carriers in an electrochemical cell. The FIB system has an anode and cathode physically separated from each other, but in common contact with a fluoride ion conducting electrolyte. The anode is typically a low potential element or compound, and can be a metal, metal fluoride, or intercalating composition. Similarly, the cathode can be element or composition, and can be a metal, metal fluoride, or intercalating composition that has a higher potential than the anode. Fluoride ions ($F^-$) in the fluoride conducting electrolyte go from the cathode to the anode during discharge and from the anode to the cathode during the charge of the battery:

Discharge:

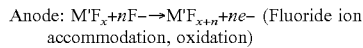

Anode: $M'F_x + nF^- \rightarrow M'F_{x+n} + ne-$ (Fluoride ion accommodation, oxidation)

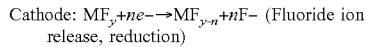

Cathode: $MF_y + ne- \rightarrow MF_{y-n} + nF^-$ (Fluoride ion release, reduction)

Transition metal fluorides are preferably used as cathode materials and alkaline earth or rare-earth metals are preferably used as anode materials. Examples of suitable anode and cathode metals are depicted in FIG. 1C.

During charge, the reverse reactions occur. For example, a FIB cell reaction based on fluoride anion transfer between Ca and Cu, both metals capable of forming metal fluorides, might be:

$Ca + CuF_2 \rightarrow CaF_2 + Cu$      Discharge:

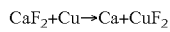

$CaF_2 + Cu \rightarrow Ca + CuF_2$      Charge:

Two major challenges exist to enable stable, reliable long-term cycling of FIB electrodes. Firstly, reversibility of the electrochemical reactions above is observed when the metal or metal fluoride active materials are nano-sized (i.e. at least one of the particle size dimensions is less than 1 μm). However, particles with such small dimensions have high surface energies and are often reactive with the electrolyte components (e.g. $F^-$) to give undesirable side-reactions including "self-discharge" (i.e. a chemical reaction such as $M + nF^- \rightarrow MF_n$ that does not general electrical current). What is needed is formation of a coating, shell, layer or the like to encapsulate the active material particles while still permitting passage of $F^-$ ions when desired (i.e. during electrochemical charge or discharge) The encapsulating material can also protect the active materials from such side-reactions, enabling long-term cycling stability of these electrode materials.

Secondly, such electrochemical reactions are conversion processes, with the structure of the metal or metal fluoride being broken down during the electrochemical process and reformed as the metal fluoride or metal, respectively, during the process. This conversion process results in a significant volume change between charged and discharged states of the active material, as indicated by the examples given in Table 1 below:

TABLE 1

Volume Change In Metal To Metal Fluoride Conversion

| Metal | Metal Fluoride | Volume Change During Conversion $M + nF^- \rightarrow MF_n$ |
|---|---|---|
| Fe | $FeF_3$ | 311% |
| Pb | $PbF_2$ | 73% |
| Bi | $BiF_3$ | 134% |
| Co | $CoF_3$ | 351% |
| Cu | $CuF_2$ | 238% |
| Sn | $SnF_2$ | 113% |
| La | $LaF_3$ | 46% |
| Ca | $CaF_2$ | −5% |
| Mg | $MgF_2$ | 42% |
| Li | LiF | −24% |

Such significant volume changes limit usefulness of conformal protective coatings encapsulating an FIB electrode material particle, since one particular state of charge will not necessarily be conformal with the particle in a different state of charge, due to the volume changes. What is needed are compositions and processes that protect the electrode active material from side reactions with the electrolyte, allow ion conduction through an encapsulant, and have sufficient void space within the encapsulant and/or encapsulant expansion/contraction properties to accommodate the volume changes of the active material during charge and discharge without permitting direct contact between the active material and the electrolyte. In some embodiments, sufficient void space may be no void space. Such compositions and their preparation are outlined below.

In some embodiments, the methods disclosed herein can provide an electrochemically active material comprising a metal nanostructure with an outer surface; the metal nanostructure capable of forming a metal fluoride; the formation of a metal fluoride operative to provide a change in the volume of the metal nanostructure; the metal nanostructure further comprising an $LaF_3$ shell with an inner surface; the outer surface of the metal nanostructure and the inner surface of the $LaF_3$ shell defining a distance between the outer surface and the inner surface; a change in said volume operative to change said distance; the distance defining a void space between the outer surface and the inner surface; the void space decreasing or increasing with an increase or decrease in the volume of the metal nanostructure. In some embodiments, the distance can be zero, optionally less than about 1 nm, optionally less than about 3 nm, optionally less than about 5 nm, and optionally less than about 10 nm.

As used herein, the term "about" is defined to being close to as understood by one of ordinary skill in the art. In one non-limiting embodiment, the term "about" is defined to be within 10%, preferably within 5%, more preferably within 1%, and most preferably within 0.5%.

Figure 1B:
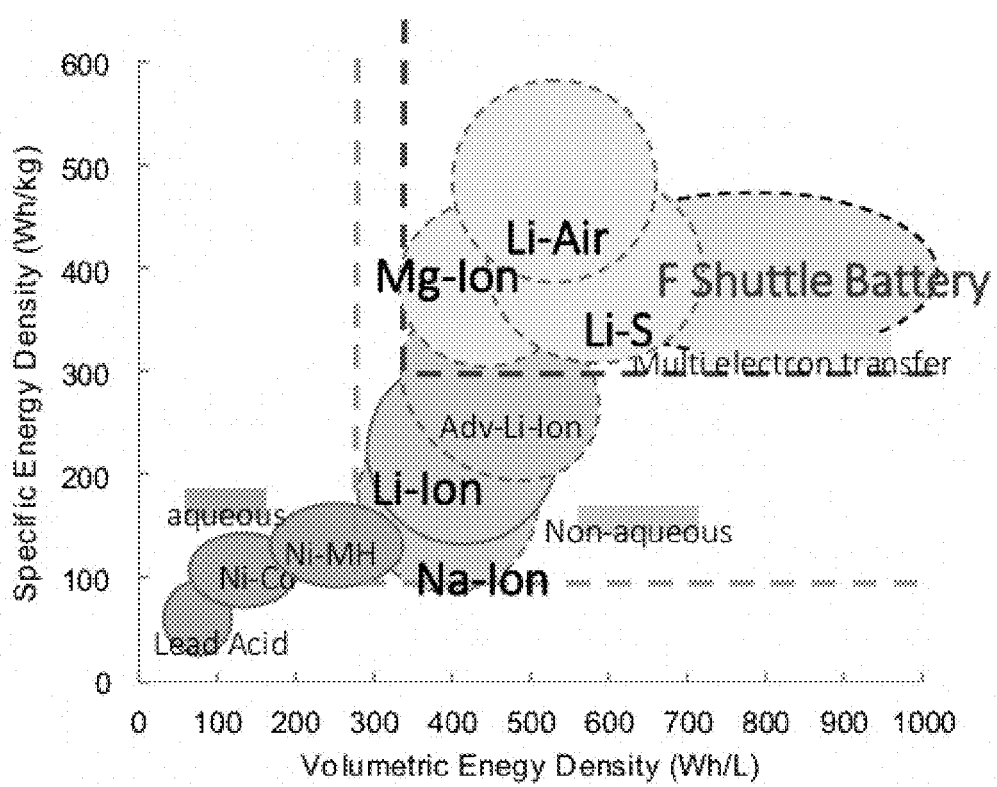
FIG. 1B depicts energy densities of various types of batteries.
Figure 1C:
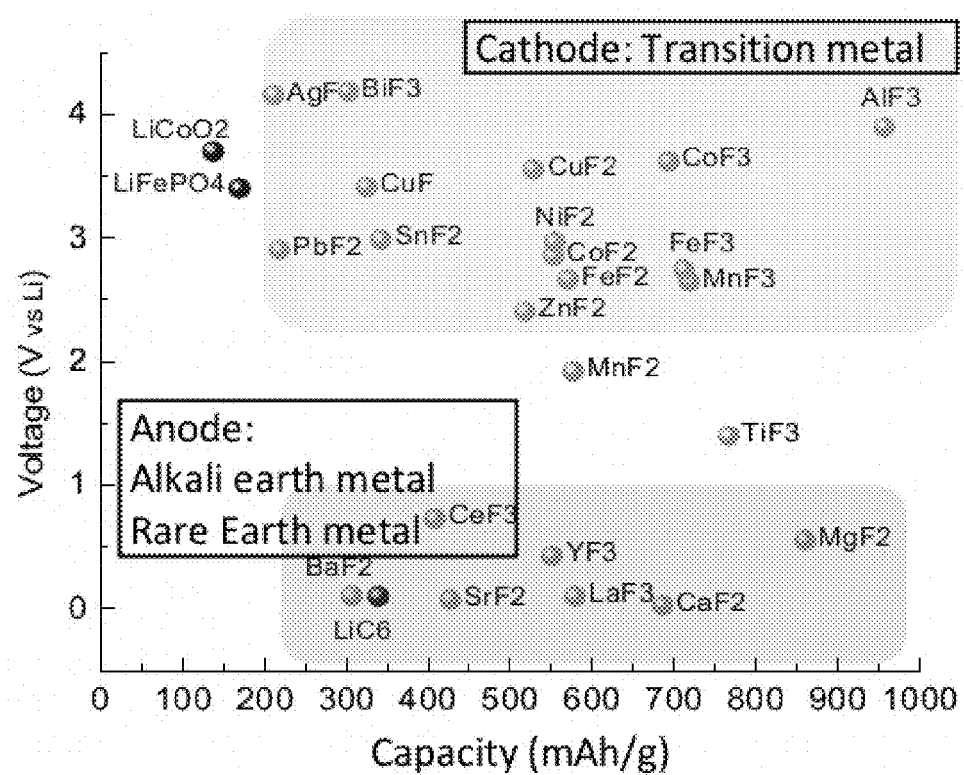
FIG. 1C depicts examples of suitable anode and cathode metals.
Figure 2:
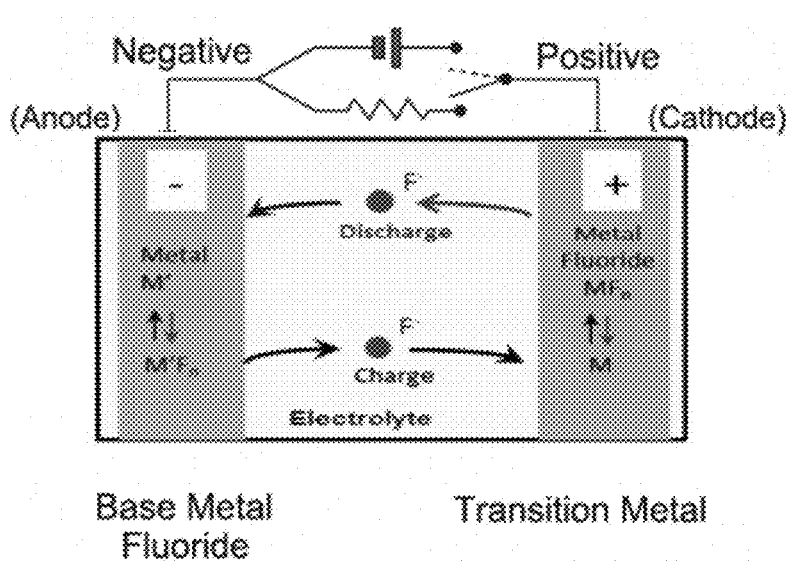
FIG. 2 is a schematic illustration of a fluoride ion electrochemical cell in an aspect of the present disclosure.
Figure 3:
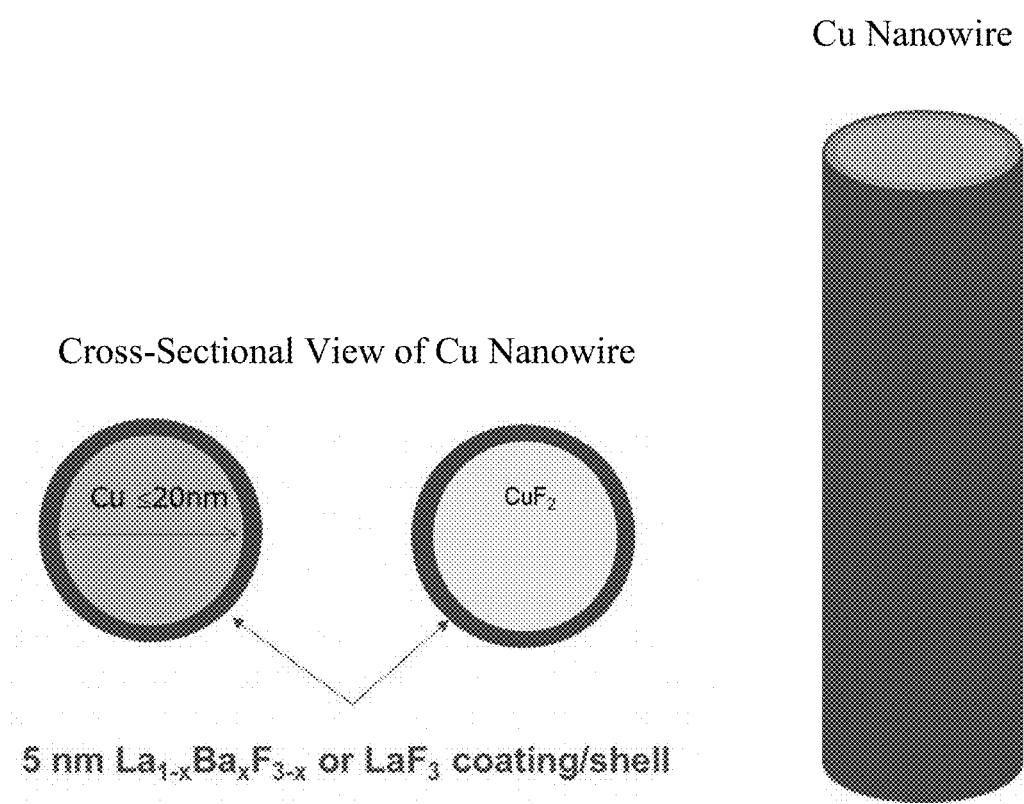
FIG. 3 illustrates the structure of Cu nanowires with a $La_{1-x}Ba_xF_{3-x}$ or $LaF_3$ coating and a cross-sectional view of the Cu nanowires.

In some embodiments as shown in FIG. 1A, the core-shell nanoparticles include a core that comprises a metal or metal alloy ("Me"), and a shell that comprises a metal halide or a metal oxyhalide. The metal of the core may be the same as the metal of the metal halide shell. In some embodiments, the metal of the core and the metal of the metal halide or metal oxyhalide shell are different metals. In some embodiments, the metal halide shell may itself comprise two metals. The core-shell nanoparticles of the present disclosure may be incorporated into a variety of methods and applications including, but not limited to, electrodes for use in electrochemical cells, including fluoride shuttle batteries as shown in FIG. 2. Compared to lithium ion batteries, F-shuttle batteries have much higher energy density, which is around four times in volumetric and two times at gravimetric densities. The energy densities of various types of batteries are illustrated in FIG. 1B and in Table 2 below:

TABLE 2

Energy Densities of F-Shuttle Batteries and Lithium Ion Batteries

|  | AN (−) | CA (+) | Specific Energy (Wh/kg) | Volumetric Energy (Wh/L) |
|---|---|---|---|---|
| F-Shuttle Battery | $MgF_2$ | Co | 1354 | 6207 |
|  | $CaF_2$ | Fe | 1086 | 4597 |
|  | $CaF_2$ | Co | 1404 | 6165 |
|  | $MgF_2$ | Bi | 716 | 4727 |
|  | $MgF_2$ | Ni | 1067 | 4894 |
|  | $LaF_3$ | Ni | 1014 | 6918 |
|  | $YF_3$ | Cu | 1042 | 5348 |
|  | $LaF_3$ | Bi | 725 | 5924 |
| Li Ion Battery | Graphite | $LiCoO_2$ | 380 | 953 |
|  | Graphite | $LiFePO_4$ | 407 | 936 |

The metals or metal alloys used to form the core include, but are not limited to, iron nanoparticles, cobalt nanoparticles, nickel nanoparticles, copper nanoparticles, lead nanoparticles, and alkaline earth metal nanoparticles. In a preferred embodiment, the metal nanoparticles are selected from the group consisting of cobalt nanoparticles and copper nanoparticles. In another preferred embodiment, the metal nanoparticles are copper nanoparticles. The metals used to form the core may be synthesized by mixing a metal precursor solution with a reducing agent to form metal nanoparticles.

In some embodiments, the shell of the core-shell nanoparticles is deposited directly on the metal core and may entirely surround the core as shown in FIG. 1A. In some embodiments, the metal salt used to form the shell is selected from the group consisting of alkali metal salts, alkaline earth metal salts, and transition metal salts. In certain embodiments, the metal salt used to form the shell is a transition metal salt. In certain embodiments, the metal salt used to form the shell is selected from the group consisting of lanthanum salts, cerium salts, and magnesium salts. In certain embodiments, the metal salt used to form the shell is selected from the group consisting of lanthanum salts and cerium salts. In certain embodiments, the metal salt is a lanthanum salt. In a preferred embodiment, the lanthanum salt is lanthanum nitrate. In some embodiments, the halide salt is sodium fluoride. In a non-limiting example, the shell comprises a metal fluoride or metal oxyfluoride containing material (i.e. $CeF_3$, CeOF, LaOF, $LaF_3$).

The terms core and electrode active material are used interchangeably herein. Similarly, the terms shell and encapsulant are used interchangeably herein.

In other embodiments, the present disclosure is directed to an electrode comprising the core-shell nanoparticles disclosed herein. All aspects and embodiments described with respect to the core-shell nanoparticles and methods of making thereof apply with equal force to the electrode. In a non-limiting example, the electrode is part of an F-shuttle battery system.

In some aspects, the present disclosure is directed to a fluoride shuttle battery comprising the electrode and a liquid electrolyte.

An "inert atmosphere" refers to a gaseous mixture that contains little or no oxygen and comprises inert or non-reactive gases or gases that have a high threshold before they react. An inert atmosphere may be, but is not limited to, molecular nitrogen or an inert gas, such as argon, or mixtures thereof.

A "reducing agent" is a substance that causes the reduction of another substance, while it itself is oxidized. Reduction refers to a gain of electron(s) by a chemical species, and oxidation refers to a loss of electron(s) by a chemical species.

A "metal salt" is an ionic complex wherein the cation(s) is(are) a positively charged metal ion(s) and the anion(s) is(are) a negatively charged ion(s). "Cation" refers to a positively charged ion, and "anion" refers to a negatively charged ion. In a "metal salt" according to the present disclosure, the anion may be any negatively charged chemical species. Metals in metal salts according to the present disclosure may include but are not limited to alkali metal salts, alkaline earth metal salts, transition metal salts, aluminum salts, or post-transition metal salts, and hydrates thereof.

"Alkali metal salts" are metal salts in which the metal ions are alkali metal ions, or metals in Group I of the periodic table of the elements, such as lithium, sodium, potassium, rubidium, cesium, or francium.

"Alkaline earth metal salts" are metal salts in which the metal ions are alkaline earth metal ions, or metals in Group II of the periodic table of the elements, such as beryllium, magnesium, calcium, strontium, barium, or radium.

"Transition metal salts" are metal salts in which the metal ions are transition metal ions, or metals in the d-block of the periodic table of the elements, including the lanthanide and actinide series. Transition metal salts include, but are not limited to, salts of scandium, titanium, vanadium, chromium, manganese, iron, cobalt, nickel, copper, zinc, yttrium, zirconium, niobium, molybdenum, technetium, ruthenium, rhodium, palladium, silver, cadmium, lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, osmium, iridium, platinum, gold, mercury, actinium, thorium, protactinium, uranium, neptunium, plutonium, americium, curium, berkelium, californium, einsteinium, fermium, mendelevium, nobelium, and lawrencium.

"Post-transition metal salts" are metal salts in which the metal ions are post-transition metal ions, such as gallium, indium, tin, thallium, lead, bismuth, or polonium.

A "halide salt" is an ionic complex in which the anion(s) is(are) halide ion(s), including but not limited to fluoride ion(s), chloride ion(s), bromide ion(s), and iodide ion(s). A "fluoride salt" is an ionic complex in which the anion(s) is(are) fluoride ion(s). According to the present disclosure, the cation of the halide salt or the fluoride salt may be any positively charged chemical species.

A "metal fluoride" is an ionic complex in which the cation is one or more metal ion(s) and the anion(s) is(are) fluoride ion(s). According to some aspects of the present disclosure, the metal salt(s) and the fluoride salt react to create a metal fluoride shell around the metal nanoparticle core. Similarly, a "metal halide" is an ionic complex in which the cation is one or more metal ion(s) and the anion(s) is(are) halide ion(s).

A "fluoride-containing" salt is an ionic complex in which the anion(s) contain fluoride ion but are not limited to being solely fluoride. Instead, "fluoride-containing" salts include ionic complexes where the anion(s) contain fluoride itself in complex with other ions or atoms. "Fluoride-containing" salts suitable for use in aspects of the present disclosure include those known to persons of ordinary skill in the art, including, but not limited to, fluoride salts, non-metal fluoroanions such as tetrafluoroborate salts and hexafluorophosphate salts, and oxyfluoride salts. In some aspects of the present disclosure, the fluoride-containing salts may include quaternary ammonium fluorides and fluorinated organic compounds. According to some aspects of the present disclosure, the metal salt and the fluoride-containing salt react to create a fluoride-containing shell around the metal nanoparticle core.

The term "electrode" refers to an electrical conductor where ions and electrons are exchanged with an electrolyte and an outer circuit. "Positive electrode" and "cathode" are used synonymously in the present description and refer to the electrode having the higher electrode potential in an electrochemical cell (i.e. higher than the negative electrode). "Negative electrode" and "anode" are used synonymously in the present description and refer to the electrode having the lower electrode potential in an electrochemical cell (i.e. lower than the positive electrode). Cathodic reduction refers to a gain of electron(s) of a chemical species, and anodic oxidation refers to the loss of electron(s) of a chemical species. Positive and negative electrodes of the present invention may be provided in a range of useful configurations and form factors as known in the art of electrochemistry and battery science, including thin electrode designs, such as thin film electrode configurations. Electrodes are manufactured as known in the art, including as disclosed in, for example, U.S. Pat. No. 4,052,539, and Oxtoby et al., Principles of Modern Chemistry (1999), pp. 401-443.

The term "electrochemical cell" refers to devices and/or device components that convert chemical energy into electrical energy or vice versa. Electrochemical cells have two or more electrodes (e.g., positive and negative electrodes) and an electrolyte, wherein electrode reactions occurring at the electrode surfaces result in charge transfer processes. Electrochemical cells include, but are not limited to, primary batteries, secondary batteries, and electrolysis systems. General cell and/or battery construction is known in the art (see, e.g., Oxtoby et al., Principles of Modern Chemistry (1999), pp. 401-443).

"Electrolyte" refers to an ionic conductor which can be in the solid state, the liquid state (most common), or more rarely a gas (e.g., plasma).

Example 1. Initial Synthesis of Cu Nanowires with a Cross-Sectional Diameter of about 20 nm (without a $La_{1-x}Ba_xF_{3-x}$ or $LaF_3$ Coating)

Figure 4:
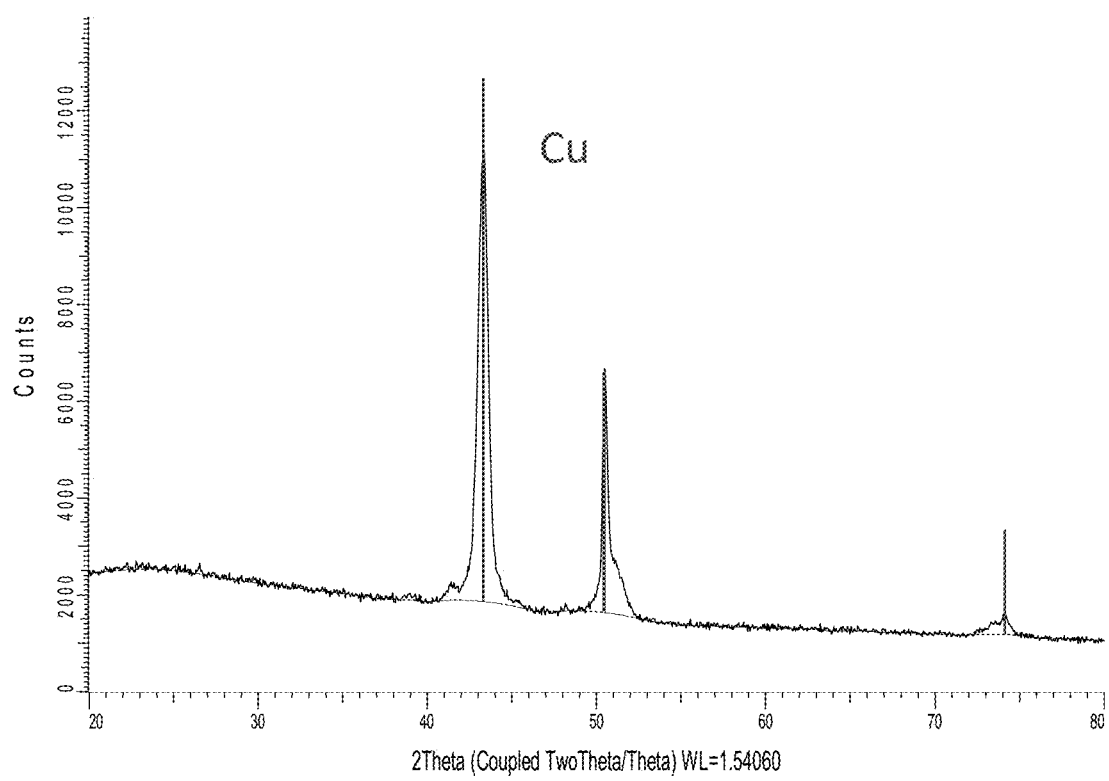
FIG. 4 shows XRD spectra of Cu nanowires (without a $La_{1-x}Ba_xF_{3-x}$ or $LaF_3$ coating, according to some aspects of the present disclosure.
Figure 5A:
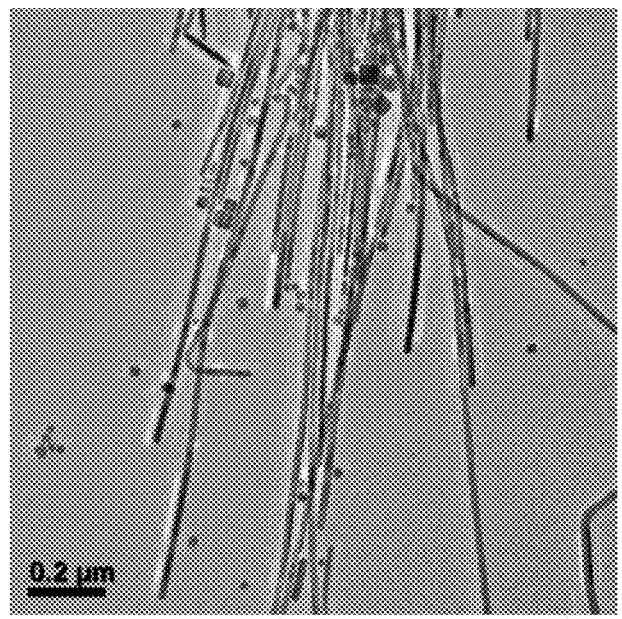
FIG. 5A and FIG. 5B shows TEM images of Cu nanowires (without a $La_{1-x}Ba_xF_{3-x}$ or $LaF_3$ coating).
Figure 5B:
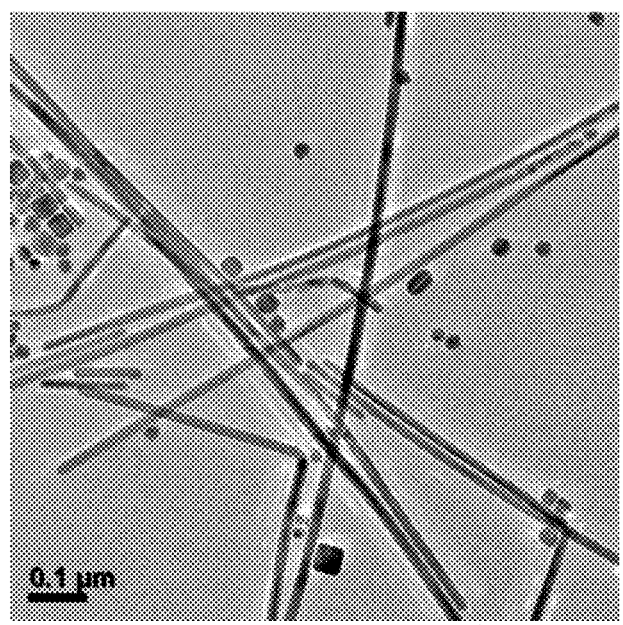

The method of synthesizing Cu nanowires has been reported in F Cui et al., Synthesis of Ultrathin Copper Nanowires Using Tris(trimethylsilyl)silane for High-Performance and Low-Haze Transparent Conductors, Nano Letters 2015, 15, 7610-7615. In this example, a solution of $CuCl_2$ $2H_2O$ (85 mg, 0.5 mmol) in oleylamine (5 g, 18.7 mmol) and oleic acid (0.1 g, 0.354 mmol) was sonicated in a glass vial until completely dissolved. Tris(trimethylsilyl)silane (0.5 g, 2.0 mmol) was added, and the mixture was heated up to 120° C. until the dark blue solution turned clear yellow. The mixture was heated further to 165° C. for 18 h. The Cu nanowires were isolated via centrifuge (12,000 rpm for 10 min.) and washed three times with toluene (10 mL). The XRD spectra and TEM images of the Cu nanowires produced in this example are illustrated in FIGS. 4, 5A and 5B, respectively.

Example 2. Two Phase Shell Formation on Cu Nanowires

In general, a method of making an electrochemically active material comprises providing an organic solution including a metal nanostructure, adding a first amount of one or more quaternary amine salts to the organic solution, adding a lanthanum salt to the organic solution, optionally removing water from the organic solution, adding a second amount of one or more quaternary amine salts to the organic solution, adding a fluoride source to the organic solution (to form an $LaF_3$ shell on the metal nanostructure), optionally removing water from the organic solution, and optionally adding an organic solvent to the organic solution to distribute the $LaF_3$ coated metal nanostructure. Removing water from the organic solution is non-limiting and can be separating water from organic or separating organic from water by various methods known in the art.

About 20 mg of Cu nanowires were re-dispersed in 50 ml toluene. A first portion of tetrabutylammonium bromide (0.322 g, 1.0 mmol) was added into the Cu nanowires toluene suspension. A solution of $La(NO_3)_3$ $6H_2O$ (0.866 g, 2.0 mmol) in water (50 mL) was injected at 5 mL/min into the toluene suspension. This mixture was stirred very rapidly for 2 hours. The water layer was removed via a separatory funnel and a second portion of tetrabutylammonium bromide (0.322 g, 1.0 mmol) was added to the toluene layer. A solution of NaF (0.084 g, 2.0 mmol) in water (50 mL) was injected at 5 mL/min into the stirring toluene suspension. This mixture was stirred very rapidly for additional 2 hours. The water layer was removed via separatory funnel and ethanol (20 mL) was added to distribute the product. The product was isolated via centrifuge (12,000 rpm for 10 min) then washed twice with EtOH (20 mL).

As set forth above, the two phase shell formation method can be applied to nanowires. However, the applications of the same coating method is not limited to nanowires or relevant applications. Even further the core material is not limited to copper. In one example, the coated structures may be used as a cathode material in a Fluoride Shuttle battery. In another example, the Fluoride Shuttle battery comprises a liquid electrolyte.

Figure 6:
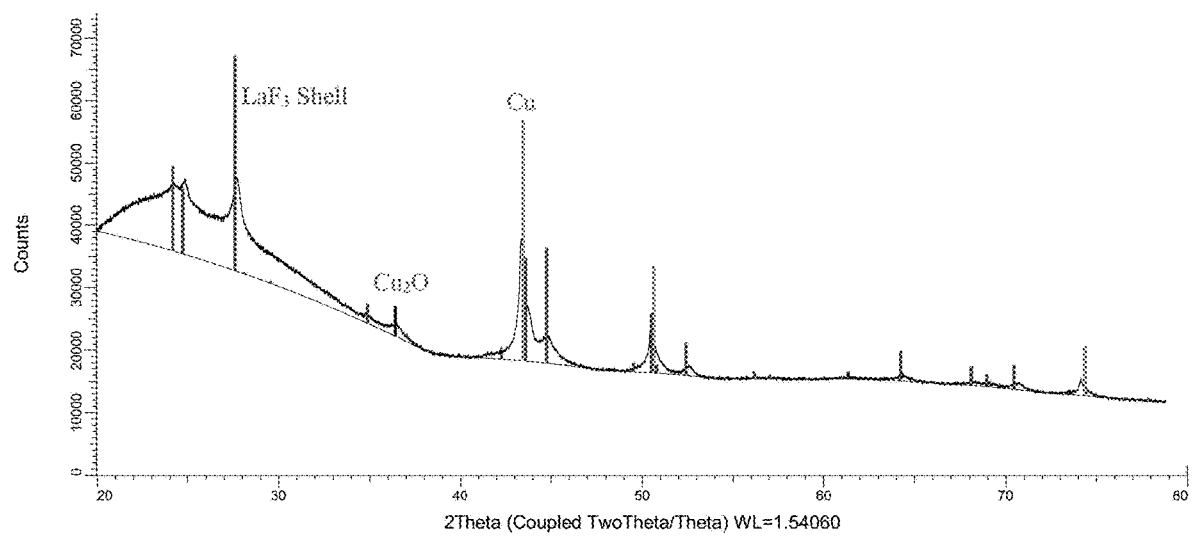
FIG. 6 shows the XRD spectra of Cu nanowires (with a diameter about or less than 20 nm), small amount of $Cu_2O$ after shell formation, and $LaF_3$ shell of Cu nanowires, according to some aspects of the present disclosure.
Figure 8A:
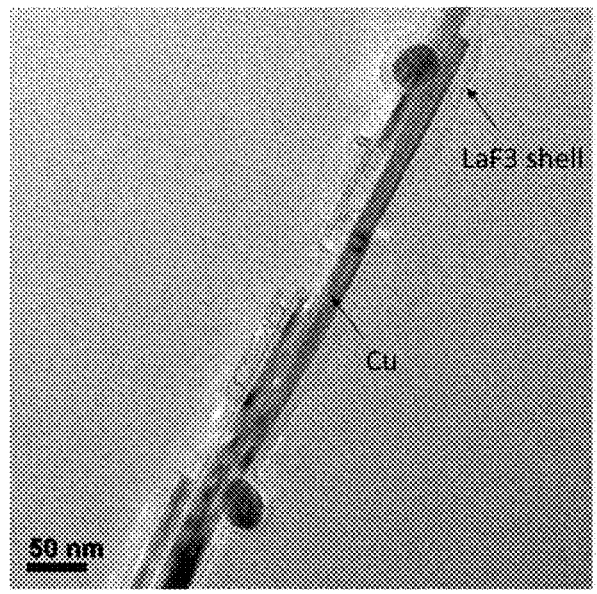
FIGS. 8A, 8B, and 8C show TEM images of $LaF_3$ formation on/around Cu nanowires under different magnifications/resolutions, according to some aspects of the present disclosure.
Figure 8B:
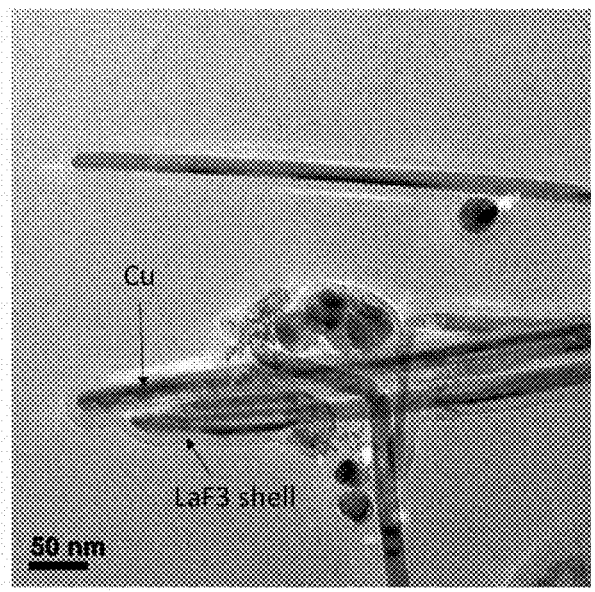
Figure 8C:
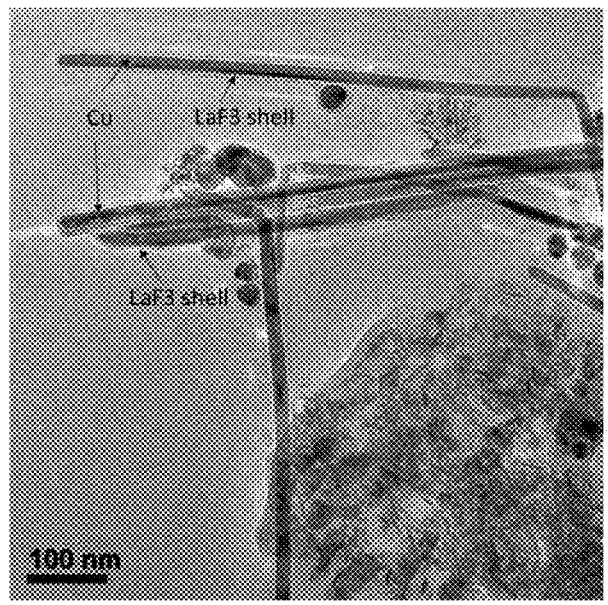

The XRD spectra of Cu nanowires, a small amount of $Cu_2O$ after shell formation, and the $LaF_3$ shell of Cu nanowires are depicted in FIG. 6. FIGS. 7A and 7B delineate SEM images of Cu nanowires prior to and after two phase $LaF_3$ shell formation, respectively. TEM images with different magnifications in FIGS. 8A, 8B, and 8C show the formation of $LaF_3$ shells around Cu nanowires. In the images, the grey areas surrounding the Cu nanowires are the $LaF_3$ shells.

Figure 9:
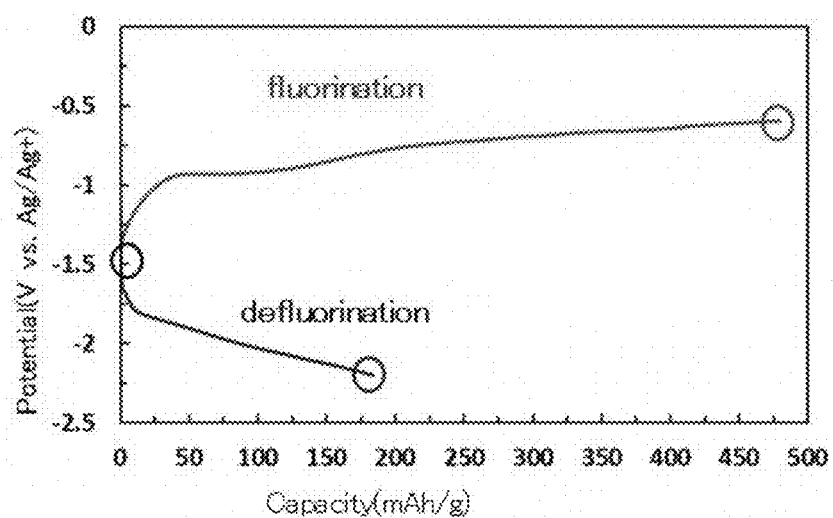
FIG. 9 shows the voltage profile of the charge-discharge cycle of an electrode made of Cu nanowires encapsulated in $LaF_3$ shells (CuNW@$LaF_3$), according to some aspects of the present disclosure.

FIG. 9 shows the voltage profile of the charge-discharge cycle of an electrode made of Cu nanowires encapsulated in $LaF_3$ shells (CuNW@$LaF_3$) compared to the Ag/Ag$^+$ reference electrode. The capacity delivery of electrode made of CuNW encapsulated in $LaF_3$ shells reaches 183 mAh/g compared to 95.2 mAh/g for Cu@$Ba_xLa_{1-x}F_{3-x}$ and 50.2 mAh/g for Cu@$LaF_3$, respectively. Thus, the electrode made of Cu nanowires encapsulated in $LaF_3$ shells nearly doubles the capacity of Cu@$Ba_xLa_{1-x}F_{3-x}$ and nearly has four times the capacity of Cu@$LaF_3$. Without wishing to be bound to any particular theory, it is believed that the amount of $CuF_2$ formation directly determines the capacity of the battery. The more $CuF_2$ that is formed, the higher the capacity of the battery can be achieved. Therefore, the utilization of Cu can be significantly increased by Cu nanowires coupled with $LaF_3$ encapsulation. In one embodiment, CuNW@$LaF_3$ can reach about 35% of theoretical capacity of $CuF_2$, whereas Cu@$Ba_xLa_{1-x}F_{3-x}$ and Cu@$LaF_3$ can reach about 18% and 9.5% of the theoretical capacity of $CuF_2$, respectively.

Figure 10:
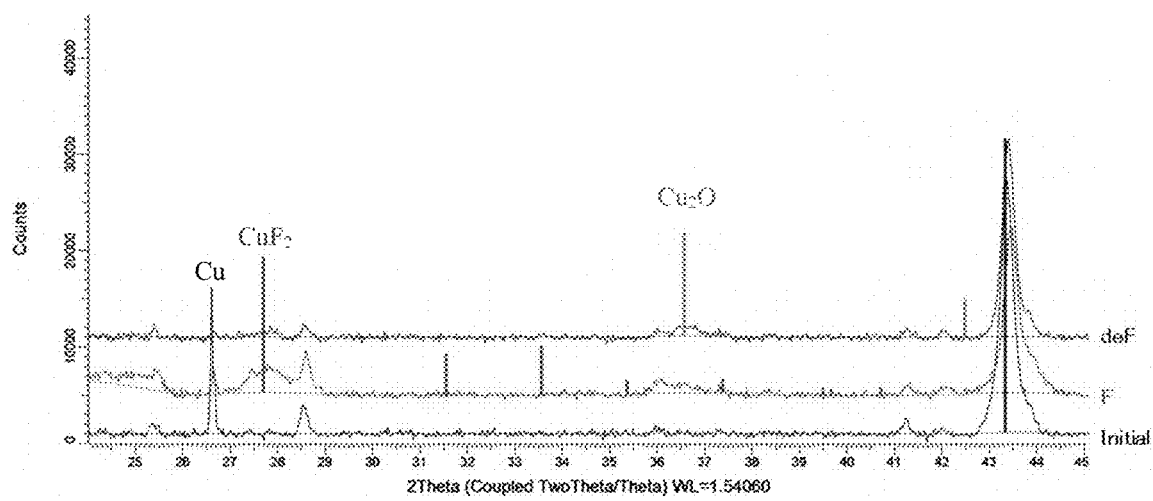
FIG. 10 shows the XRD spectra of CuNW@$LaF_3$ in initial condition, after a charge (fluorination, F), and a subsequent discharge (defluorination, deF), according to some aspects of the present disclosure.

In addition, FIG. 10 shows the XRD spectra of CuNW@$LaF_3$ in initial condition, i.e., in an electrode before a use, and then after a charge (fluorination) and a subsequent discharge (defluorination), respectively. $CuF_2$ can be formed after charge and then reduced to Cu after discharge. FIG. 10 indicates that Cu in the form of nanowires coupled with $LaF_3$ shells can be cycled in liquid electrolytes.

Other Metal Materials Suitable for Making Nanostructures:

In the present disclosure, the metal nanostructures suitable for making cathodic electrode are not limited to copper. As shown in FIG. 1C, transition metals and any salts thereof can be used to prepare the nanostructures encapsulated in various coating layers as disclosed in the previous section. Suitable transition metal comprises metals in the d-block of the periodic table of the elements, including the lanthanide and actinide series. Transition metal salts include, but are not limited to, salts of scandium, titanium, vanadium, chromium, manganese, iron, cobalt, nickel, copper, zinc, yttrium, zirconium, niobium, molybdenum, technetium, ruthenium, rhodium, palladium, silver, cadmium, lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, osmium, iridium, platinum, gold, mercury, actinium, thorium, protactinium, uranium, neptunium, plutonium, americium, curium, berkelium, californium, einsteinium, fermium, mendelevium, nobelium, and lawrencium.

While the aspects described herein have been described in conjunction with the example aspects outlined above, various alternatives, modifications, variations, improvements, and/or substantial equivalents, whether known or that are or may be presently unforeseen, may become apparent to those having at least ordinary skill in the art. Accordingly, the example aspects, as set forth above, are intended to be illustrative, not limiting. Various changes may be made without departing from the spirit and scope of the disclosure. Therefore, the disclosure is intended to embrace all known or later-developed alternatives, modifications, variations, improvements, and/or substantial equivalents.

Thus, the claims are not intended to be limited to the aspects shown herein, but are to be accorded the full scope consistent with the language of the claims, wherein reference to an element in the singular is not intended to mean "one and only one" unless specifically so stated, but rather "one or more." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The word "example" is used herein to mean "serving as an example, instance, or illustration." Any aspect described herein as "example" is not necessarily to be construed as preferred or advantageous over other aspects. Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. Nothing disclosed herein is intended to be dedicated to the public regardless of whether such disclosure is explicitly recited in the claims.

As used herein, the term "nanostructure" refers to a structure having at least one dimension on the nanoscale, that is, at least one dimension between about 0.1 and 1000 nm. It should be understood that "nanostructures" include, but are not limited to, nanosheets, nanotubes, nanoparticles (e.g., polyhedral nanoparticles), nanospheres, nanowires, nanocubes, and combinations thereof. A nanosheet may comprise a sheet having a thickness on the nanoscale. A nanowire may comprise a wire having a diameter on the nanoscale. A nanoparticle may comprise a particle wherein each spatial dimension thereof is on the nanoscale.

The examples are put forth so as to provide those of ordinary skill in the art with a complete disclosure and description of how to make and use the present invention, and are not intended to limit the scope of what the inventors regard as their invention nor are they intended to represent that the experiments below are all or the only experiments performed. Efforts have been made to ensure accuracy with respect to numbers used (e.g. amounts, dimensions, etc.) but some experimental errors and deviations should be accounted for.

Moreover, all references throughout this application, for example patent documents including issued or granted patents or equivalents; patent application publications; and non-patent literature documents or other source material; are hereby incorporated by reference herein in their entireties, as though individually incorporated by reference.

What is claimed is:

1. A method of making a core shell structure, the method comprising:
   dispersing a metal nanostructure in a first organic solvent to form a first suspension;
   adding a first amount of a quaternary amine salt to the first suspension;
   adding a lanthanum salt solution to the first suspension, wherein the lanthanum salt solution comprises a lanthanum salt and water;
   removing the water from the first suspension to form a first organic solvent layer;
   adding a second amount of a quaternary amine salt to the first organic solvent layer to form a second suspension;
   adding a fluoride source solution to the second suspension to form a $LaF_3$ shell on the metal nanostructure, wherein the fluoride source solution comprises a fluoride source and water;
   removing the water from the second suspension to form a second organic solvent layer; and
   adding a second organic solvent to the second organic solvent layer to distribute the metal nanostructure having a $LaF_3$ shell.

2. The method of claim 1, further comprising:
   collecting the metal nanostructure having the $LaF_3$ shell; and
   washing the metal nanostructure having the $LaF_3$ shell with a third organic solvent.

3. The method of claim 1, wherein the quaternary amine salt is tetrabutylammonium bromide.

4. The method of claim 1, wherein the lanthanum salt solution is lanthanum(III) nitrate solution.

5. The method of claim 1, wherein the fluoride source solution is NaF solution.

6. The method of claim 1, wherein the metal comprises a transition metal selected from scandium, titanium, vanadium, chromium, manganese, iron, cobalt, nickel, copper, zinc, yttrium, zirconium, niobium, molybdenum, technetium, ruthenium, rhodium, palladium, silver, cadmium, lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, osmium, iridium, platinum, gold, mercury, actinium, thorium, protactinium, uranium, neptunium, plutonium, americium, curium, berkelium, californium, einsteinium, fermium, mendelevium, nobelium, lawrencium, and combinations thereof.

7. The method of claim 1, wherein the metal comprises copper.

8. The method of claim 1, wherein the nanostructure is selected from nanoparticles, nanotubes, nanowires, nanoframes, nanoflakes, or a combination thereof.

9. The method of claim 1, wherein the nanostructure is a nanowire.

10. The method of claim 1, wherein the first organic solvent comprises toluene.

11. The method of claim 1, wherein the second organic solvent comprises ethanol.

12. The method of claim 2, wherein the third organic solvent comprises ethanol.

13. The method of claim 1, wherein the metal nanostructure comprises copper nanowires; wherein both the first and the second amounts of quaternary amine salt are tetrabutylammonium bromide; wherein the lanthanum salt is $La(NO_3)_3$; and wherein the fluoride source is NaF.

14. A method of making an electrochemically active material, the method comprising:
    providing an organic solution including a metal nanostructure;
    adding a first amount of a quaternary amine salt to the organic solution;
    adding a lanthanum salt to the organic solution;
    adding a second amount of a quaternary amine salt to the organic solution; and
    adding a fluoride source to the organic solution to form a $LaF_3$ shell on the metal nanostructure.

15. The method of claim 14, further comprising removing water from the organic solution.

16. The method of claim 15, further comprising adding a second organic solvent to the organic solution to distribute the metal nanostructure having a $LaF_3$ shell.

17. The method of claim 14, wherein water is removed from the organic solution after adding a lanthanum salt to the organic solution and before adding a second amount of a quaternary amine salt to the organic solution.

* * * * *